(12) United States Patent
Chiu et al.

(10) Patent No.: US 11,682,728 B2
(45) Date of Patent: Jun. 20, 2023

(54) STRUCTURE OF HIGH-VOLTAGE TRANSISTOR AND METHOD FOR FABRICATING THE SAME

(71) Applicants: United Microelectronics Corp., Hsinchu (TW); Chun-Ya Chiu, Tainan (TW); Chih-Kai Hsu, Tainan (TW); Chin-Hung Chen, Tainan (TW); Chia-Jung Hsu, Tainan (TW); Ssu-I Fu, Kaohsiung (TW); Yu-Hsiang Lin, New Taipei (TW)

(72) Inventors: Chun-Ya Chiu, Tainan (TW); Chih-Kai Hsu, Tainan (TW); Chin-Hung Chen, Tainan (TW); Chia-Jung Hsu, Tainan (TW); Ssu-I Fu, Kaohsiung (TW); Yu-Hsiang Lin, New Taipei (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 302 days.

(21) Appl. No.: 17/073,038

(22) Filed: Oct. 16, 2020

(65) Prior Publication Data
US 2022/0093798 A1   Mar. 24, 2022

(30) Foreign Application Priority Data
Sep. 21, 2020   (CN) .......................... 202010993261.3

(51) Int. Cl.
*H01L 29/78* (2006.01)
*H01L 29/08* (2006.01)
(Continued)

(52) U.S. Cl.
CPC .... *H01L 29/7848* (2013.01); *H01L 21/02521* (2013.01); *H01L 21/02532* (2013.01);
(Continued)

(58) Field of Classification Search
CPC ......... H01L 21/02521; H01L 21/02532; H01L 21/823412; H01L 29/0847; H01L 29/0878;
(Continued)

(56) References Cited

U.S. PATENT DOCUMENTS 7,977,715 B2   7/2011   Cai
9,793,394 B1 * 10/2017   Zhu ..................... H01L 29/1087
(Continued)

OTHER PUBLICATIONS

Jong Mun Park, et al., "Hot-carrier behaviour and ron-BV trade-off optimization for p-channel LDMOS transistors in a 180 nm HV-CMOS technology", International Symposium on Power Semiconductor Devices and ICs, Jun. 3-7, 2012, pp. 189-192.

*Primary Examiner* — David C Spalla
(74) *Attorney, Agent, or Firm* — J.C. Patents

(57) ABSTRACT

The disclosure discloses a structure of high-voltage (HV) transistor which includes a substrate. An epitaxial doped structure with a first conductive type is formed in the substrate, wherein a top portion of the epitaxial doped structure includes a top undoped epitaxial layer. A gate structure is disposed on the substrate and at least overlapping with the top undoped epitaxial layer. A source/drain (S/D) region with a second conductive type is formed in the epitaxial doped structure at a side of the gate structure. The first conductive type is different from the second conductive type.

15 Claims, 4 Drawing Sheets

(51) Int. Cl.
*H01L 29/165* (2006.01)
*H01L 29/267* (2006.01)
*H01L 29/66* (2006.01)
*H01L 21/02* (2006.01)

(52) U.S. Cl.
CPC ........ *H01L 29/0847* (2013.01); *H01L 29/165* (2013.01); *H01L 29/267* (2013.01); *H01L 29/66636* (2013.01)

(58) Field of Classification Search
CPC . H01L 29/1083; H01L 29/165; H01L 29/267; H01L 29/66636; H01L 29/7816; H01L 29/7848
See application file for complete search history.

(56) References Cited

U.S. PATENT DOCUMENTS

2012/0181625 A1* 7/2012 Kwok ............... H01L 29/66628
257/E21.409
2016/0056285 A1* 2/2016 Chiang ............... H01L 29/7816
257/344
2018/0076326 A1* 3/2018 Roh ....................... H01L 29/167

* cited by examiner

STRUCTURE OF HIGH-VOLTAGE TRANSISTOR AND METHOD FOR FABRICATING THE SAME

CROSS-REFERENCE TO RELATED APPLICATION

This application claims the priority benefit of China application serial no. 202010993261.3, filed on Sep. 21, 2020. The entirety of the above-mentioned patent application is hereby incorporated by reference herein and made a part of this specification.

BACKGROUND

Field of the Disclosure

The disclosure relates to manufacturing of semiconductor, and particularly to a structure of high-voltage transistor and a manufacturing method thereof.

Description of Related Art

For electronic products with diverse functions, its control circuit needs to be able to simultaneously drive high-voltage components operating at a high voltage and components operating at a low voltage. To adapt to the operation of high-voltage components and low-voltage components, for example, the power module needs to be able to provide high-voltage power supply and low-voltage power supply. High-voltage circuit plays an important role in the control of power modules. In other words, in order to increase more driving capabilities, the overall integrated circuit will contain high-voltage transistors to drive different actions.

High-voltage transistors operate at relatively high voltages, and the magnitude of breakdown voltage of the voltage transistors is an important factor that determines its quality. A high-voltage transistor with a higher breakdown voltage can withstand high-voltage operation for a relatively long time without causing breakdown, thereby maintaining the service life of the product.

In order to increase the breakdown voltage of high-voltage transistors, in addition to increasing the thickness of the gate insulating layer, the doped structure thereof served as source and drain will also be adjusted, so that the channel of the transistor can be normally and stably operated under high voltage.

The design of the doped structure of the source and drain will affect the breakdown voltage of the high voltage transistor. Therefore, how to design the doped structure of the source and drain of the high voltage transistor is still under development.

SUMMARY OF THE DISCLOSURE

The disclosure provides a structure of a high-voltage transistor and a manufacturing method thereof. The doped structure of its source and drain can effectively increase the breakdown voltage and maintain a large operating current.

In an embodiment, the disclosure provides a structure of high-voltage (HV) transistor, which includes a substrate. An epitaxial doped structure with a first conductive type is formed in the substrate, wherein a top portion of the epitaxial doped structure includes a top undoped epitaxial layer. A gate structure is disposed on the substrate and at least overlapping with the top undoped epitaxial layer. A source/drain (S/D) region with a second conductive type is formed in the epitaxial doped structure at a side of the gate structure. The first conductive type is different from the second conductive type.

In an embodiment, in the structure of high-voltage transistor, the epitaxial doped structure includes a plurality of doped epitaxial layers located under the top undoped epitaxial layer, and the doping concentration of the first conductivity type is in decreasing in a gradient manner.

In an embodiment, in the structure of high-voltage transistor, the epitaxial doped structure includes a bottom undoped epitaxial layer, which is interfaced with the substrate.

In an embodiment, in the structure of high-voltage transistor, the substrate is a silicon substrate, and the epitaxial doped structure includes a plurality of silicon epitaxial layers. The top silicon epitaxial layer is the top undoped epitaxial layer, the bottom silicon epitaxial layer is a bottom undoped epitaxial layer, and a part of the plurality of silicon epitaxial layers is formed between the top undoped epitaxial layer and the bottom undoped epitaxial layer, and serves as the doped epitaxial layer.

In an embodiment, in the structure of high-voltage transistor, the first conductive layer is of the N conductivity type or the P conductivity type, and the plurality of doped epitaxial layers are respectively and correspondingly doped with the N conductivity type dopant or P conductivity type dopant.

In an embodiment, in the structure of high-voltage transistor, the plurality of doped epitaxial layers include SiP with N-conductivity type or SiGe with P-conductivity type.

In an embodiment, in the structure of high-voltage transistor, the gate structure includes a high-voltage gate insulating layer disposed on the substrate. The gate layer is disposed on the high-voltage gate insulating layer. The spacer wall is arranged on the substrate and on the side wall of the gate layer. The top undoped epitaxial layer is located under the spacer wall and extends below the high-voltage gate insulating layer.

In an embodiment, the disclosure also provides a method of manufacturing a high-voltage transistor, including providing a substrate. The manufacturing method further includes forming a recess in the substrate. An epitaxial doped structure with the first conductivity type is formed in the recess of the substrate, wherein the top portion of the epitaxial doped structure includes a top undoped epitaxial layer. A gate structure is formed on the substrate and at least overlaps with the top undoped epitaxial layer. The source/drain region with the second conductivity type is formed in the epitaxial doped structure at a side of the gate structure. The first conductivity type is different from the second conductivity type.

In an embodiment, in the method of manufacturing the high-voltage transistor, the formed epitaxial doped structure includes a plurality of doped epitaxial layers located under the top undoped epitaxial layer, and the doping concentration of the first conductivity type is decreasing in a gradient manner.

In an embodiment, in the method of manufacturing the high-voltage transistor, the formed epitaxial doped structure includes a bottom undoped epitaxial layer, which is interfaced with the substrate.

In an embodiment, in the method of manufacturing the high-voltage transistor, the provided substrate is a silicon substrate, and the formed epitaxial doped structure includes a plurality of silicon epitaxial layers. The top silicon epitaxial layer is the top undoped epitaxial layer, the bottom silicon epitaxial layer is a bottom undoped epitaxial layer, and a part of the plurality of silicon epitaxial layers is formed between the top undoped epitaxial layer and the bottom undoped epitaxial layer, and serves as the doped epitaxial layer.

In an embodiment, in the method of manufacturing the high-voltage transistor, the first conductive layer is of the N conductivity type or the P conductivity type, and the plurality of doped epitaxial layers are respectively and correspondingly doped with the N conductivity type dopant or P conductivity type dopant.

In an embodiment, in the method of manufacturing the high-voltage transistor, the plurality of doped epitaxial layers include SiP with N-conductivity type or SiGe with P-conductivity type.

In an embodiment, in the method of manufacturing the high-voltage transistor, the formed gate structure includes a high-voltage gate insulating layer disposed on the substrate. The gate layer is disposed on the high-voltage gate insulating layer. The spacer wall is arranged on the substrate and on the side wall of the gate layer. The top undoped epitaxial layer is located under the spacer wall and extends below the high-voltage gate insulating layer.

In an embodiment, in the method of manufacturing the high-voltage transistor, the step of forming the epitaxial doped structure includes an in-situ doping process to form a plurality of doped epitaxial layers.

BRIEF DESCRIPTION OF THE DRAWINGS

The accompanying drawings are incorporated to further facilitate understanding of the disclosure, and the accompanying drawings are incorporated into this specification and constitute a part of this specification. The drawings illustrate embodiments of the disclosure, and together with the description serve to explain the principles of the disclosure.

DESCRIPTION OF EMBODIMENTS

The disclosure relates to the structure of a high-voltage transistor and a manufacturing method thereof. An epitaxial doped structure with different conductivity types is added under the source and drain of the high-voltage transistor, which can effectively increase the breakdown voltage and maintain a large operating current.

To adapt to an integrated circuit that can operate at both high voltage and low voltage, high-voltage transistors are the main components for operation under high voltage. High-voltage transistors with higher breakdown voltage can improve the quality and service life of integrated circuits.

The disclosure provides a design for high-voltage transistor, which can effectively increase the breakdown voltage. Several embodiments are given below to illustrate the disclosure, but the disclosure is not limited to the embodiments below.

Before providing the design for a high-voltage transistor that can increase the breakdown voltage, the disclosure first looks into the structure of a more direct high-voltage transistor, and then further provides a high-voltage transistor that can effectively improve the breakdown voltage.

Figure 1:
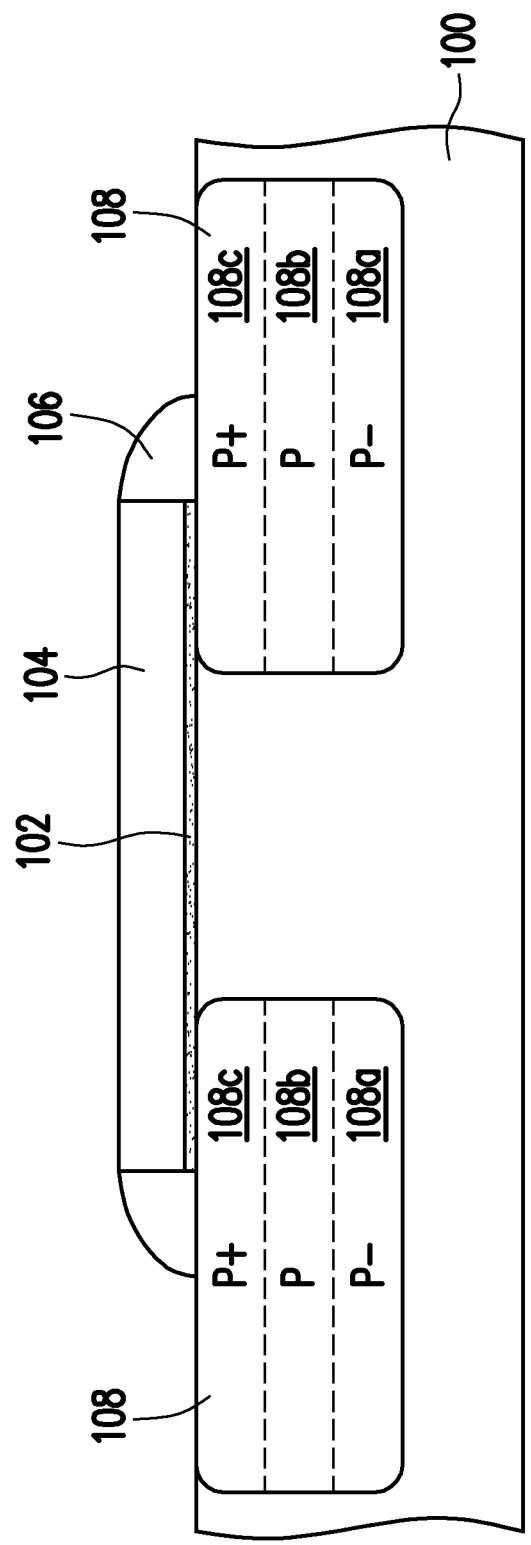
FIG. 1 is a schematic view of a structure of a high-voltage transistor according to an embodiment of the disclosure.

FIG. 1 is a schematic view of a structure of a high-voltage transistor according to an embodiment of the disclosure. Referring to FIG. 1, according to the structure of the field effect transistor, in the metal-oxide-semiconductor (MOS) structure, which is like a general low-voltage field effect transistor and is still based on a silicon substrate 100. A gate insulating layer 102, a gate layer 104, and a spacer wall 106 on the side wall of the gate layer 104 are formed on the MOS structure. To adapt to the operation under high voltage, the thickness of the gate insulating layer 102 will increase to withstand the high-voltage operation. In addition, the doped region 108 serving as source or drain are also formed in the substrate 100 on both sides of the gate layer 104. The high-voltage transistor can be a P-type transistor or an N-type transistor. In this embodiment, a P-type transistor is taken as an example, and the doped region 108 is of P conductivity type. The conductivity type of N-type transistors is opposite to that of P-type transistors.

In order to increase the breakdown voltage of the transistor, the doped region 108, for example, adopts the control of doping concentration. By using multiple doping processes, the doped region 108 has a plurality of doped layers depending on the doping concentration, for example, the plurality of doped layers include a doped layer 108a, a doped layer 108b, and a doped layer 108c. The doping concentration is decreasing in a gradient manner from the surface of the substrate 100. For example, the doping concentration of the doped layer 108c is greater than that of the doped layer 108b. The doping concentration of the doped layer 108b is greater than that of the doped layer 108a.

In the structure of high-voltage transistor shown in FIG. 1, the doped region 220 is designed with a decreasing concentration, which can increase the breakdown voltage. However, after looking into the structure, it was observed that the operating current may still be insufficient. The disclosure further provides the structure of the high-voltage transistor, which can increase the breakdown voltage and maintain a large operating current.

Figure 2:
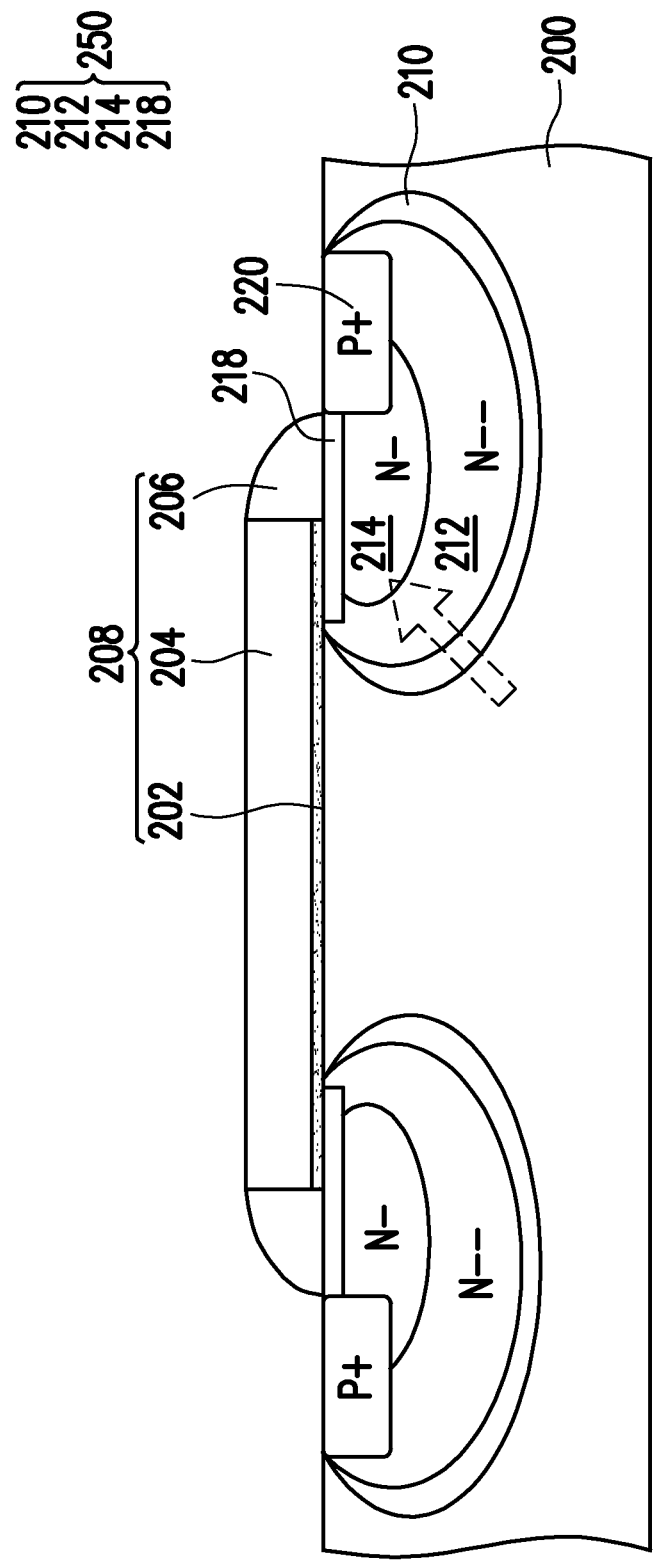
FIG. 2 is a schematic view of the structure of the high-voltage transistor according to an embodiment of the disclosure.

FIG. 2 is a schematic view of the structure of the high-voltage transistor according to an embodiment of the disclosure. Referring to FIG. 2, a substrate 200 serves as a structural basis for the high-voltage transistor. In this embodiment, a P-type high-voltage transistor is taken as an example for description. For an N-type high-voltage transistor, the conductivity type of its dopant can be N type to replace the N-type dopant.

The structure of high-voltage transistor includes a substrate 200. An epitaxial doped structure 250 having a first conductivity type, such as an N conductivity type, is formed in the substrate 200. The epitaxial doped structure 250 forms a recess in the center of the substrate 200, and then an epitaxial process is performed in the recess to form an epitaxial layer in the recess. In the process of forming the epitaxial layer, in-situ doping is also adopted simultaneously, so the epitaxial doped structure 250 includes multiple doped epitaxial layers 212 and 214. In addition, the top portion of the epitaxial doped structure 250 includes a top undoped epitaxial layer 218. The bottom of the epitaxial doped structure 250 in an embodiment also includes a bottom undoped epitaxial layer 210 interfaced with the substrate 200. The epitaxial doped structure 250 includes, for example, a bottom undoped epitaxial layer 210, a doped epitaxial layer 212, a doped epitaxial layer 214, and a top undoped epitaxial layer 218. More details will follow in the description of FIG. 3 and FIG. 4.

The gate structure 208 is disposed on the substrate 200 and at least overlaps with the top undoped epitaxial layer 218. As opposed to the first conductivity type, the second conductivity type is, for example, the doped region 220 with P+, which serves as the source/drain region of the transistor and is formed in the epitaxial doped structure 250 on a side of the gate structure 208.

The gate structure 208 includes a high-voltage gate insulating layer 202 and is disposed on the substrate 200. The thickness of the high-voltage gate insulating layer 202 is adjusted to be able to withstand the high voltage to adapt to operation under high voltage, and the above-mentioned thickness is not limited to a specific value. The gate layer 204 is, for example, a polysilicon layer, which is disposed on the high-voltage gate insulating layer 202. The spacer wall 206 is disposed on the substrate 200 and on the side wall of the gate layer 204.

The top undoped epitaxial layer 218 is located under the spacer wall 206 and extends below the high-voltage gate insulating layer 202. The top undoped epitaxial layer 218 overlaps with the gate layer 204 below the same. The top undoped epitaxial layer 218 can produce a high impedance effect, which can further prevent voltage breakdown.

The first conductivity type is, for example, N type that is different from the second conductivity type of the doped region 220. The second conductivity type in this embodiment is P type and denoted by P+. In the silicon epitaxial process, for example, phosphorus is used to provide N-type dopants, that is, phosphorus and silicon are combined to form SiP as the epitaxial material. Moreover, based on the concentration of phosphorus, the doped epitaxial layer 212 and the doped epitaxial layer 214 are formed in sequence. The concentration is increased in a gradient manner as shown by arrows, and the concentration is indicated by N-- and N-. The bottom undoped epitaxial layer 210 and the top undoped epitaxial layer 218 are substantially free of phosphorus or their content of phosphorus is nearly zero. The doped region 220 is formed subsequently by using an implantation process instead of an epitaxial process. The concentration of the doped region 220 is P+, and serves as source and drain, and is formed in the epitaxial doped structure 250 while covering a part of the top undoped epitaxial layer 218.

Here, to manufacture an N-type high-voltage transistor, the N-type dopant of phosphorus, for example, can be changed to a P-type dopant, such as Ge, and the material of the doped epitaxial layers 212 and 214 is changed to SiGe. The doped region 220 serving as source and drain is changed to N+ doping, which is formed subsequently by using the implantation process.

Here, the structural replacement of the epitaxial doped structure 250 can be as shown in FIG. 1 by being directly implanted to the substrate, thereby effectively increasing the driving current, and the control of the dopant can increase the breakdown voltage. The top undoped epitaxial layer 218 further provides a high impedance effect and can also increase the breakdown voltage.

Figure 3:
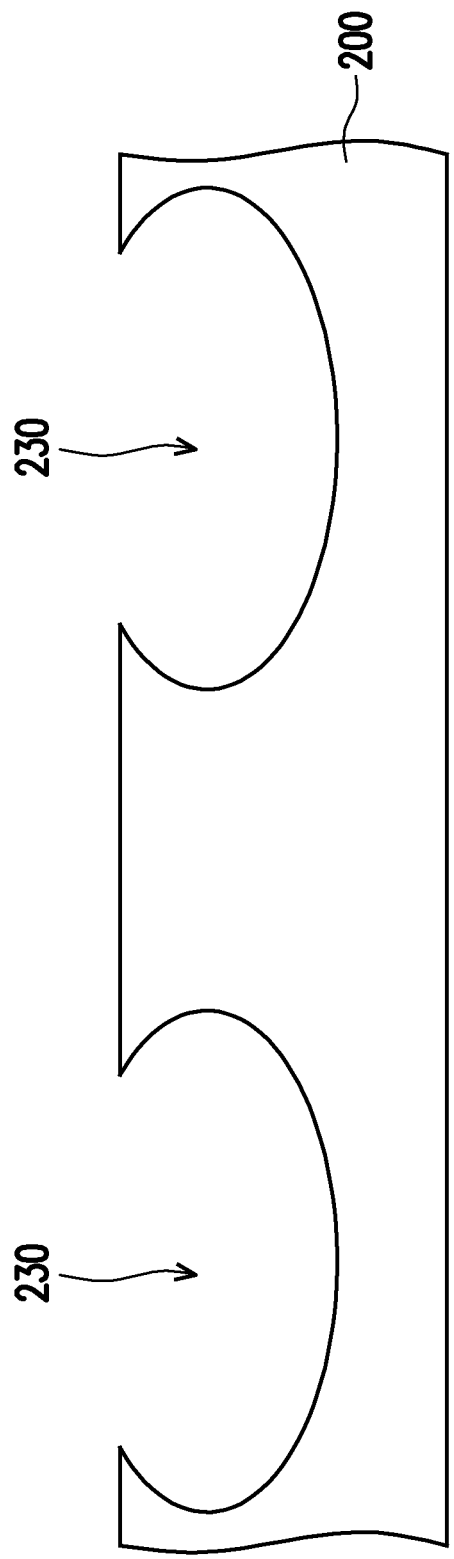
FIG. 3 to FIG. 4 are schematic views of the process of forming an epitaxial doped structure according to an embodiment of the disclosure.
Figure 4:
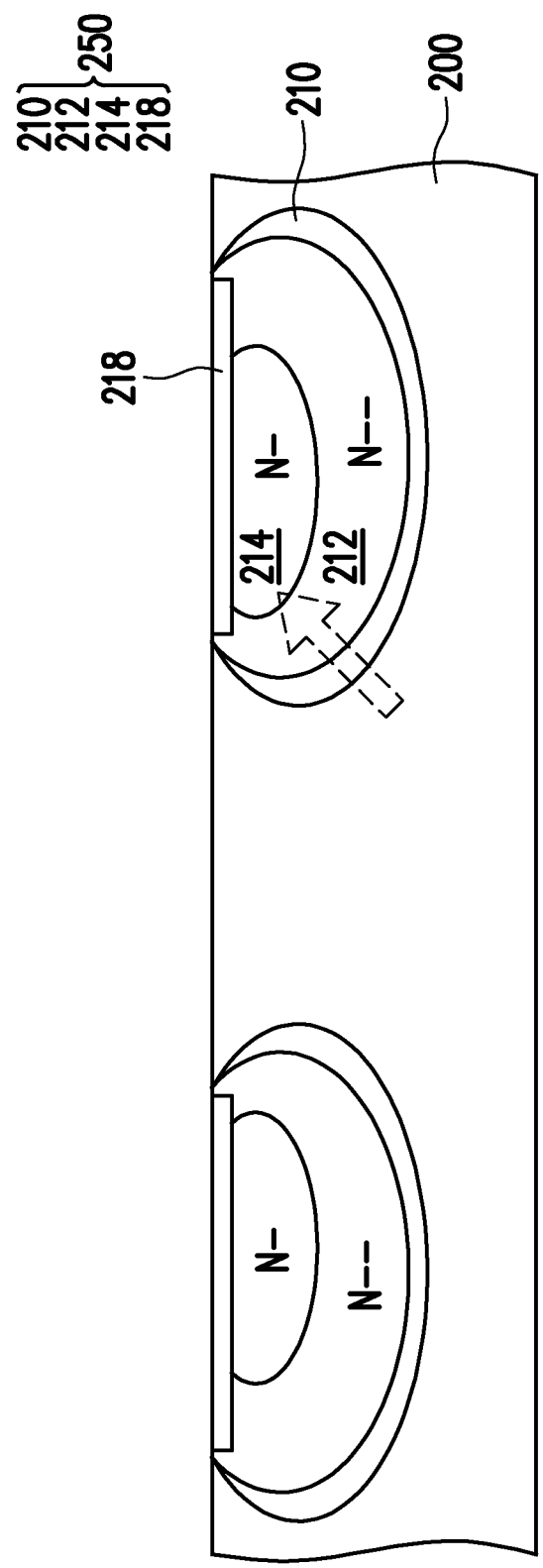

FIG. 3 to FIG. 4 are schematic views of the process of forming an epitaxial doped structure according to an embodiment of the disclosure. Referring to FIG. 3, in the substrate 200, for example, a mask layer and a wet etching process are adopted to first form a recess 230 at a predetermined position. Referring to FIG. 4, taking the structure of the N-type epitaxial doped structure 250 as an example, an epitaxial process for SiP is applied, wherein the content of phosphorus (P) determines the concentration of the N-type doping. In the bottom undoped epitaxial layer 210 and the top undoped epitaxial layer 218, the content of phosphorus (P) is substantially zero. Here, the geometric shape of the top undoped epitaxial layer 218 is only for exemplary illustration, and in fact, it may be a layer with unequal thickness. As shown in FIG. 2, the top undoped epitaxial layer 218 can extend below the gate layer 204 to provide a high impedance effect. The number of doped epitaxial layers 212 and 214 between the top undoped epitaxial layer 218 and the bottom undoped epitaxial layer 210 is multiple, and is not limited to two as specified in the embodiment. The top undoped epitaxial layer 218 can be formed by other suitable semiconductor manufacturing processes, and is not limited to an epitaxial process. In addition, before the gate structure 208 is formed subsequently, for example, a polishing and planarization process may also be applied first. That is, the process of forming the epitaxial doped structure 250 of the disclosure can achieve the desired structure according to the processes available in semiconductor manufacturing technology.

In an embodiment, the disclosure also provides a method for manufacturing a high-voltage transistor, which includes providing a substrate 200 as a structural basis for manufacturing. Next, the recess 230 is formed in the substrate 200. The epitaxial doped structure 250 with first conductivity type, such as N type, is formed in the recess 230 of the substrate 200. The top portion of the epitaxial doped structure 250 includes the top undoped epitaxial layer 218. The gate structure 208 is formed on the substrate 200 and at least overlaps with the top undoped epitaxial layer 218. The doped region 220 with second conductivity type, such as P-type, is formed in the epitaxial doped structure 250 on a side of the gate structure 208. The first conductivity type, such as N type, is different from the second conductivity type, such as P type.

Finally, it should be noted that the above embodiments are only used to illustrate the technical solutions of the present disclosure, but not to limit it. Although the present disclosure has been described in detail with reference to the foregoing embodiments, those of ordinary skill in the art should understand that it is still possible to modify the technical solutions described in the foregoing embodiments, or equivalently replace some or all of the technical features; these modifications or replacements do not make the nature of the corresponding technical solutions deviate from the scope of the technical solutions in the embodiments of the present disclosure.

What is claimed is:

1. A structure of high-voltage transistor, comprising:
   a substrate;
   an epitaxial doped structure with a first conductivity type and formed in the substrate, wherein a top portion of the epitaxial doped structure comprises a top undoped epitaxial layer;
   a gate structure disposed on the substrate and at least overlapping with the top undoped epitaxial layer; and
   a source/drain region with a second conductivity type and formed in the epitaxial doped structure on a side of the gate structure,
   wherein the first conductivity type is different from the second conductivity type.

2. The structure of high-voltage transistor according to claim 1, wherein the epitaxial doped structure comprises a plurality of doped epitaxial layers located under the top undoped epitaxial layer, and a doping concentration of the first conductivity type decreases in a gradient manner.

3. The structure of high-voltage transistor according to claim 2, wherein the epitaxial doped structure comprises a bottom undoped epitaxial layer, which is interfaced with the substrate.

4. The structure of high-voltage transistor according to claim 2, wherein the substrate is a silicon substrate, and the epitaxial doped structure comprises a plurality of silicon epitaxial layers,
wherein a top silicon epitaxial layer is the top undoped epitaxial layer, a bottom silicon epitaxial layer is a bottom undoped epitaxial layer, and a part of the plurality of silicon epitaxial layers is between the top undoped epitaxial layer and the bottom undoped epitaxial layer and serves as the doped epitaxial layer.

5. The structure of high-voltage transistor according to claim 2, wherein the first conductive layer is of N conductivity type or P conductivity type, and the plurality of doped epitaxial layers are respectively and correspondingly doped with a N conductivity type dopant or a P conductivity type dopant.

6. The structure of high-voltage transistor according to claim 5, wherein the plurality of doped epitaxial layers comprise SiP with N-conductivity type or SiGe with P-conductivity type.

7. The structure of high-voltage transistor according to claim 1, wherein the gate structure comprises:
a high-voltage gate insulating layer disposed on the substrate;
a gate layer disposed on the high-voltage gate insulating layer; and
a spacer wall disposed on the substrate and located on a side wall of the gate layer,
wherein the top undoped epitaxial layer is located under the spacer wall and extends below the high-voltage gate insulating layer.

8. A manufacturing method for high-voltage transistor, comprising:
providing a substrate;
forming a recess in the substrate;
forming an epitaxial doped structure with a first conductivity type in the recess of the substrate, wherein a top portion of the epitaxial doped structure comprises a top undoped epitaxial layer;
forming a gate structure on the substrate and at least overlapping with the top undoped epitaxial layer; and
forming a source/drain region with a second conductivity type in the epitaxial doped structure on a side of the gate structure,
wherein the first conductivity type is different from the second conductivity type.

9. The manufacturing method for high-voltage transistor according to claim 8, wherein the formed epitaxial doped structure comprises a plurality of doped epitaxial layers located under the top undoped epitaxial layer, and a doping concentration of the first conductivity type decreases in a gradient manner.

10. The manufacturing method for high-voltage transistor according to claim 9, wherein the formed epitaxial doped structure comprises a bottom undoped epitaxial layer, which is interfaced with the substrate.

11. The manufacturing method for high-voltage transistor according to claim 9, wherein the provided substrate is a silicon substrate, and the formed epitaxial doped structure comprises a plurality of silicon epitaxial layers,
wherein a top silicon epitaxial layer is the top undoped epitaxial layer, a bottom silicon epitaxial layer is a bottom undoped epitaxial layer, and a part of the plurality of silicon epitaxial layers is between the top undoped epitaxial layer and the bottom undoped epitaxial layer and serves as the doped epitaxial layer.

12. The manufacturing method for high-voltage transistor according to claim 9, wherein the first conductive layer is of N conductivity type or P conductivity type, and the plurality of doped epitaxial layers are respectively and correspondingly doped with a N conductivity type dopant or a P conductivity type dopant.

13. The manufacturing method for high-voltage transistor according to claim 12, wherein the plurality of doped epitaxial layers comprise SiP with N-conductivity type or SiGe with P-conductivity type.

14. The manufacturing method for high-voltage transistor according to claim 8, wherein the formed gate structure comprises:
a high-voltage gate insulating layer disposed on the substrate;
a gate layer disposed on the high-voltage gate insulating layer; and
a spacer wall disposed on the substrate and located on a side wall of the gate layer,
wherein the top undoped epitaxial layer is located under the spacer wall and extends below the high-voltage gate insulating layer.

15. The manufacturing method for high-voltage transistor according to claim 8, wherein the step of forming the epitaxial doped structure comprises an in-situ doping process to form a plurality of doped epitaxial layers.

\* \* \* \* \*

UNITED STATES PATENT AND TRADEMARK OFFICE
CERTIFICATE OF CORRECTION

| | | |
|---|---|---|
| PATENT NO. | : 11,682,728 B2 | Page 1 of 1 |
| APPLICATION NO. | : 17/073038 | |
| DATED | : June 20, 2023 | |
| INVENTOR(S) | : Chun-Ya Chiu et al. | |

It is certified that error appears in the above-identified patent and that said Letters Patent is hereby corrected as shown below:

On the Title Page

Column 1, delete the current applicants and add the following:
Item (71) Applicant: United Microelectronics Corp., Hsinchu (TW)

Signed and Sealed this
Sixth Day of August, 2024

Katherine Kelly Vidal
*Director of the United States Patent and Trademark Office*